US008916965B2

(12) United States Patent
Williams (10) Patent No.: US 8,916,965 B2
(45) Date of Patent: Dec. 23, 2014

(54) SEMICONDUCTOR PACKAGE CONTAINING SILICON-ON-INSULATOR DIE MOUNTED IN BUMP-ON-LEADFRAME MANNER TO PROVIDE LOW THERMAL RESISTANCE

(71) Applicant: Advanced Analogic Technologies Incorporated, Santa Clara, CA (US)

(72) Inventor: Richard K. Williams, Cupertino, CA (US)

(73) Assignee: Advanced Analogic Technologies Incorporated, Santa Clara, CA (US)

( * ) Notice: Subject to any disclaimer, the term of this patent is extended or adjusted under 35 U.S.C. 154(b) by 0 days.

(21) Appl. No.: 13/959,197

(22) Filed: Aug. 5, 2013

(65) Prior Publication Data

US 2014/0035133 A1   Feb. 6, 2014

Related U.S. Application Data

(63) Continuation of application No. 13/210,592, filed on Aug. 16, 2011, now Pat. No. 8,502,362.

(51) Int. Cl.
| | | |
|---|---|---|
| H01L 23/34 | (2006.01) | |
| H01L 23/495 | (2006.01) | |
| H01L 23/498 | (2006.01) | |
| H01L 23/433 | (2006.01) | |
| H01L 23/31 | (2006.01) | |

(52) U.S. Cl.
CPC . *H01L 23/49811* (2013.01); *H01L 2224/48464* (2013.01); *H01L 23/49572* (2013.01); *H01L 2224/48247* (2013.01); *H01L 23/49555* (2013.01); *H01L 2224/16145* (2013.01); *H01L 23/49551* (2013.01); *H01L 2224/16245* (2013.01); *H01L 23/4334* (2013.01); *H01L 2224/73265* (2013.01); *H01L 2924/13091* (2013.01); *H01L 23/3107* (2013.01); *H01L 2224/32245* (2013.01)
USPC ........... 257/713; 257/666; 257/676; 257/778; 257/E23.037

(58) Field of Classification Search
USPC .................... 257/713, 666, 676, 778, E23.037
See application file for complete search history.

(56) References Cited

U.S. PATENT DOCUMENTS

| | | | |
|---|---|---|---|
| 6,750,082 B2 | 6/2004 | Briar et al. | |
| 7,656,030 B2 * | 2/2010 | Osone et al. | 257/728 |
| 7,932,132 B2 | 4/2011 | Miyajima | |
| 7,967,184 B2 | 6/2011 | Liao et al. | |
| 7,989,305 B2 | 8/2011 | Ohnuma et al. | |
| 8,148,809 B2 | 4/2012 | Senda et al. | |
| 8,269,326 B2 * | 9/2012 | Lee | 257/676 |
| 8,502,362 B2 | 8/2013 | Williams | |
| 2006/0006532 A1 * | 1/2006 | Zuniga-Ortiz et al. | 257/737 |
| 2006/0063306 A1 | 3/2006 | Choi | |
| 2006/0131691 A1 * | 6/2006 | Roozeboom et al. | 257/534 |
| 2007/0105277 A1 | 5/2007 | Pendse et al. | |
| 2007/0216026 A1 | 9/2007 | Zhu et al. | |

(Continued)

FOREIGN PATENT DOCUMENTS

RU         2402107 C2    10/2010

*Primary Examiner* — Nitin Parekh
(74) *Attorney, Agent, or Firm* — Lando & Anastasi, LLP (57) ABSTRACT

Thermal transfer from a silicon-on-insulator (SOI) die is improved by mounting the die in a bump-on-leadframe manner in a semiconductor package, with solder or other metal bumps connecting the active layer of the SOI die to metal leads used to mount the package on a printed circuit board or other support structure.

20 Claims, 5 Drawing Sheets

(56) References Cited

U.S. PATENT DOCUMENTS

| | | |
|---|---|---|
| 2008/0081150 A1 | 4/2008 | Arao et al. |
| 2008/0210013 A1 | 9/2008 | Meehan et al. |
| 2008/0242003 A1 | 10/2008 | How et al. |
| 2010/0176480 A1* | 7/2010 | Senda et al. .......... 257/501 |
| 2011/0141696 A1 | 6/2011 | Gaul et al. |
| 2011/0193237 A1 | 8/2011 | Tian et al. |

* cited by examiner

SEMICONDUCTOR PACKAGE CONTAINING SILICON-ON-INSULATOR DIE MOUNTED IN BUMP-ON-LEADFRAME MANNER TO PROVIDE LOW THERMAL RESISTANCE

CROSS-REFERENCE TO RELATED APPLICATIONS

This application claims the benefit under 35 U.S.C. §120 as a continuation of U.S. application Ser. No. 13/210,592 titled "Semiconductor Package Containing Silicon-on-Insulator Die Mounted in Bump-on-Leadframe Manner to Provide Low Thermal Resistance" filed Aug. 16, 2011, which is incorporated herein by reference in its entirety. U.S. application Ser. No. 13/210,592 is related to U.S. application Ser. No. 11/381,292, filed May 2, 2006, titled "Bump-on-Leadframe (BOL) Package Technology with Reduced Parasitics," which is incorporated herein by reference in its entirety.

BACKGROUND OF THE INVENTION

Silicon-on-insulator semiconductor dice are used in applications where it is desired to provide a very effective insulating barrier between semiconductor devices formed in the die. A silicon-on-insulator (SOI) die consists of three layers: (1) an active layer, where the semiconductor devices are formed, (2) an insulating layer, and (3) a handle layer. The insulating layer is sandwiched between the active and handle layers. The active and handle layers are formed of silicon; the insulating layer is normally formed of silicon dioxide (frequently referred to simply as "oxide"). The insulating layer may also comprise of a sandwich of thermally grown oxides and deposited glasses or oxides. The handle layer is normally the thickest of the three layers. Since the active and handle layers are formed of silicon and therefore have the same temperature coefficient of expansion, the die is very stable thermally. Furthermore, since the insulating layer provides a strong insulating barrier, devices formed in the active layer can be electrically insulated from each other very effectively using isolation structures that extend through the active layer.

Figure 1A:
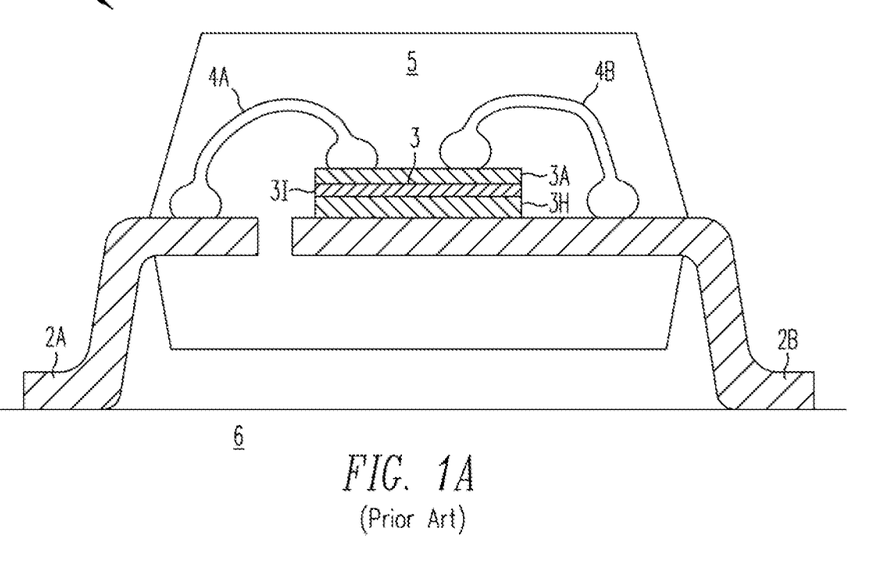
FIG. 1A shows a cross-sectional view of a conventional SOT-like package containing a silicon-on-insulator (SOI) die.

FIG. 1A shows a cross-sectional view of a conventional SOT-like semiconductor package 1 containing a SOI die 3. SOT, or "small outline transistor" is an industry standard package used in the packaging of discrete transistors or low pin count integrated circuits. SOI die 3 includes an active layer 3A, an insulating layer 3I and a handle layer 3H. SOI die 3 is mounted via the exposed surface of the handle layer 3H to a lead 2B. Devices (not shown) in active layer 3A are electrically connected to leads 2A and 2B via contact pads (not shown) at the surface of active layer 3A and via bonding wires 4A and 4B. "Gull wing" leads 2A and 2B protrude from molding compound 5. The lower surfaces of leads 2A and 2B are mounted to a printed circuit board (PCB) 6.

Figure 1B:
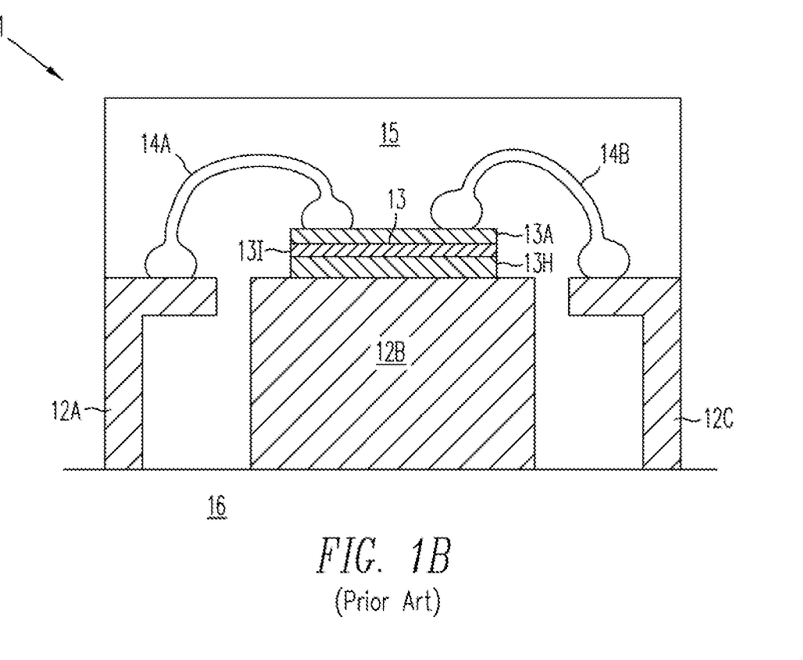
FIG. 1B shows a cross-sectional view of a conventional DFN package containing an SOI die.

FIG. 1B shows a cross-sectional view of a conventional Double_No-Lead (DFN) semiconductor package 11 containing an SOI die 13. SOI die 13 includes an active layer 13A, an insulating layer 13I and a handle layer 13H. SOI die 13 is mounted via the exposed surface of the handle layer 13H to a heat slug 12B. Devices (not shown) in active layer 13A are electrically connected to leads 12A and 12C via contact pads (not shown) at the surface of active layer 13A and via bonding wires 14A and 14B. Leads 12A and 12C have external surfaces that are coplanar with the side and bottom surfaces of molding compound 15, i.e., unlike leads 2A and 2B in FIG. 1A, leads 12A and 12C do not protrude from the molding compound 15. The lower surfaces of leads 12A and 12C and heat slug 12B are used to mount package 11 to a PCB 16.

Unfortunately, the good electrical insulation properties of an SOI die create thermal problems, in that the heat generated by devices formed in the active layer is trapped by the insulating layer. In packages 1 and 11, for example, the active layers of SOI dice 3 and 13 are physically and thermally separated from the leads by the insulating and handle layers (the bonding wires are typically very thin and do not transfer significant amounts of heat). Materials such as silicon dioxide that are used for the insulating layer are often good thermal insulators. As a result, temperatures in the active layer may reach unacceptably high levels and may damage or destroy devices formed in the SOI die.

Thus it would be very useful to provide a semiconductor package for a SOI die that facilitates the removal of heat generated by semiconductor devices formed in the die. Such a solution would allow SOI dice to live up to their full potential from both an electrical and thermal standpoint.

BRIEF SUMMARY OF THE INVENTION

In a semiconductor package according to this invention, a silicon-on-insulator (SOI) die is oriented in a bump-on-leadframe (BOL), or "flip-chip," manner, with the active layer facing a lead and a solder or other metal bump connecting a contact pad at a surface of the active layer with the lead. The solder may comprise an alloy, binary or tertiary compound of metals such as lead-tin (Pb—Sn) or tin-silver (Sn—Ag), or may comprise any soft metal such as gold, silver or tin. This forms a thermal path through which heat generated in the active layer may readily be transferred to a printed circuit board or other structure on which the package is mounted.

The invention is applicable to a wide variety of packages, including SOT-like and DFN packages.

In some embodiments the active layer of the SOI die is separated by insulating trenches into thermal islands, each thermal island being connected to a lead by means of one or more solder bumps.

BRIEF DESCRIPTION OF THE SEVERAL VIEWS OF THE DRAWING

The invention will be better understood by reference to the following drawings, which are not necessarily drawn to scale and in which like components have similar reference numerals.

DETAILED DESCRIPTION OF THE INVENTION

Figure 2A:
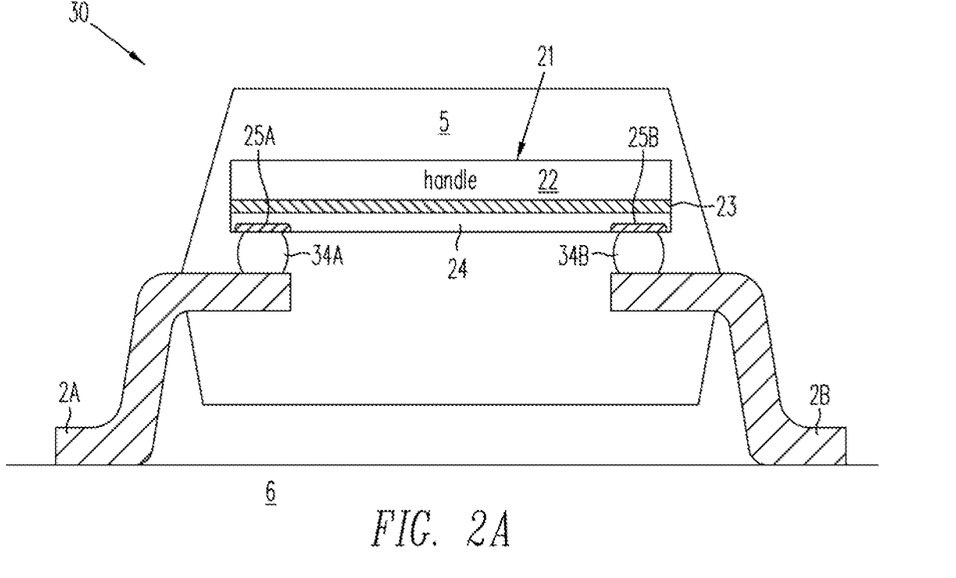
FIG. 2A shows a cross-sectional view of molded SOT-like semiconductor package containing a bump-on-leadframe (BOL) mounted SOI die, without a heat slug.

FIG. 2A illustrates a molded SOT-like package 30 in accordance with the invention. Package 30 contains an SOI die 21 with a handle layer 22, an insulating layer 23 and an active layer 24. SOI die 21 is mounted bump-on-leadframe (BOL) or "flip-chip" style on leads 2A and 2B by means of solder bumps 34A and 34B, respectively. SOI die 21 is oriented such that the active layer 24 faces leads 2A and 2B. Solder bumps 34A and 34B make electrical contact with and extend downward from contact pads 25A and 25B respectively, which are located at the surface of active layer 24. Solder bumps 34A and 34B may be made of any type of solder used in semiconductor packaging, for example a lead-tin (Pb—Sn) or tin-silver (Sn—Ag) solder, or a soft metal such as pure tin (Sn), pure silver (Ag), or gold (Au).

SOI die 21, solder bumps 34A and 34B and portions of leads 2A and 2B are encased in a molding compound 5, typically made of plastic. The "gull wing" shaped leads 2A and 2B, which are normally made of a metal such as aluminum, protrude from molding compound 5 and are mounted to a printed circuit board (PCB) 6.

Active layer 24 typically contains a plurality of semiconductor devices (MOSFETs, bipolar transistors, diodes, etc.), some of which may generate substantial amounts of heat when the circuitry in active layer 24 is operating. As shown in FIG. 2A, there are two thermal paths by which the heat generated in active layer 24 may be conducted to PCB 6: the first path includes contact pad 25A, solder bump 34A, and lead 2A, and the second path includes contact pad 25B, solder bump 34B, and lead 2B. Each of these thermal paths may also serve as an electrical path connecting the circuitry in SOI die with PCB 6.

The heat transfer characteristics of package 30 are far superior to those of the comparable prior art package 1, shown in FIG. 1A, since there are two highly conductive thermal paths through which the heat generated in SOI die 21 may be transferred to PCB 6. Moreover, some of the heat generated in SOI die 21 is removed from leads 2A and 2B by radiation and convection.

Processes for fabricating package 30 are well known in the art. In an exemplary process, solder balls are initially placed on contact pads 25A and 25B and are heated sufficiently to cause the solder to adhere to the contact pads. The placing of the solder balls can be arranged by dropping the balls through a "stencil" mask onto the die such that the balls only fall onto the die on top of or in the immediate vicinity of the bond pad to which the balls are intended to attach. SOI die 21 is then inverted, and the solder balls are brought into contact with leads 2A and 2B, respectively, which are then still part of a leadframe. The solder is then heated again (reflowed) such that the solder balls form solder bump 34A, which adheres to contact pad 25A and lead 2A, and solder bump 34B, which adheres to contact pad 25B and lead 2B. Once solder bumps 34A and 34B are attached to SOI die 21 and leads 2A and 2B, the assembly is encased in molding compound 5 by an injection molding process, then the leads are singulated from other leads in the leadframe.

Figure 2B:
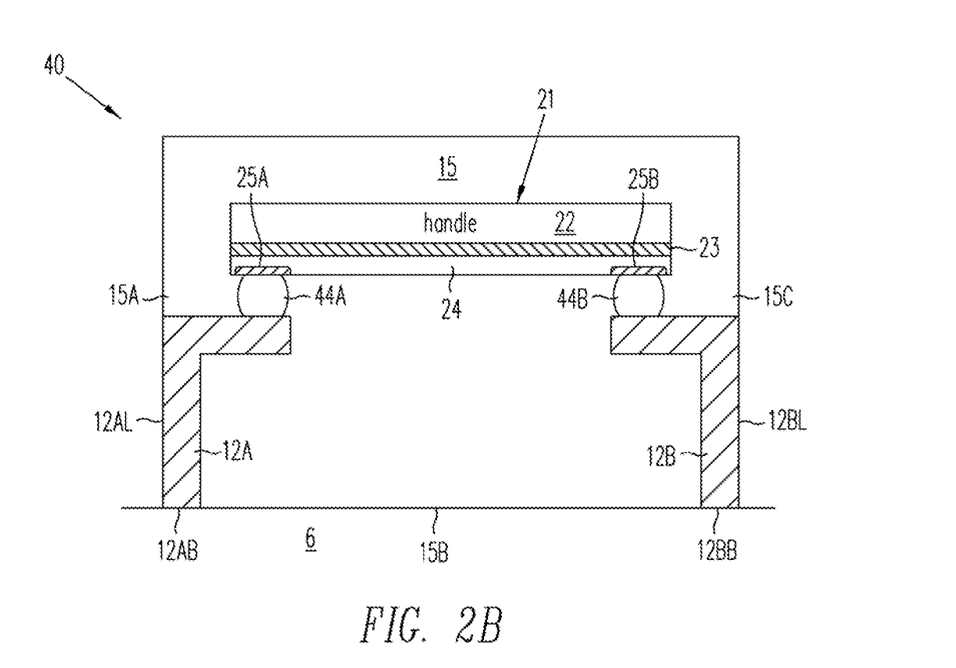
FIG. 2B shows a cross-sectional view of a Double Flat No-Lead (DFN) semiconductor package containing BOL-mounted SOI die, without a heat slug.

FIG. 2B illustrates SOI die 21 mounted in a Double No-Lead (DFN) package 40. SOI die 21 is mounted BOL-style on leads 12A and 12B by means of solder bumps 44A and 44B, respectively. Solder bumps 44A and 44B make electrical contact with and extend downward from contact pads 25A and 25B respectively.

SOI die 21, solder bumps 44A and 44B and leads 12A and 12B are encased in a molding compound 15, typically made of plastic. Unlike the gull wing shaped leads 2A and 2B in package 30, which protrude from molding compound 5, leads 12A and 12B have bottom surfaces 12AB and 12BB that are coplanar with a bottom surface 15B of molding compound 15 and lateral surfaces 12AL and 12BL that are coplanar with lateral surfaces 15A and 15C of molding compound 15. The bottom surfaces 12AB and 12BB of leads 12A and 12B are mounted to printed circuit board (PCB) 6.

As shown in FIG. 2B, there are two thermal paths by which the heat generated in active layer 24 may be conducted to PCB 6: the first path includes contact pad 25A, solder bump 44A, and lead 12A and the second path includes contact pad 25B, solder bump 44B, and lead 12B. Each of these thermal paths may also serve as an electrical path connecting the circuitry in SOI die 21 with PCB 6.

The heat transfer characteristics of package 40 are far superior to those of the comparable prior art package 11, shown in FIG. 1B, since there are two highly conductive thermal paths by which the heat generated in SOI die 21 may be transferred to PCB 6.

Figure 3A:
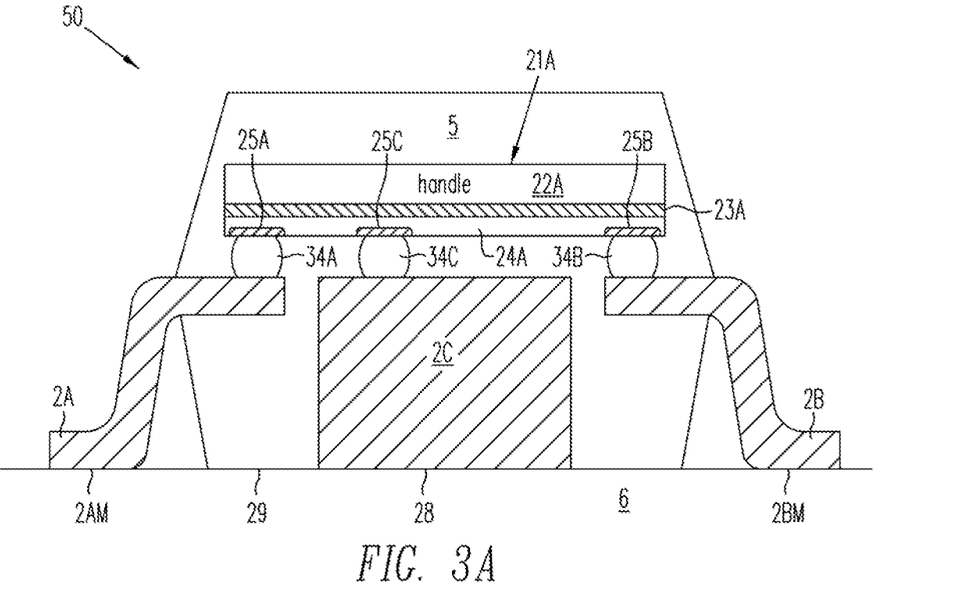
FIG. 3A shows a cross-sectional view of molded SOT-like semiconductor package containing a BOL-mounted SOI die, with an exposed heat slug.

FIG. 3A illustrates a molded SOT-like package 50 in accordance with the invention. Package 50 contains an SOI die 21A with a handle layer 22A, an insulating layer 23A and an active layer 24A, as well as an exposed die pad or heat slug 2C. Contact pads 25A, 25B and 25C are located at the exposed surface of active layer 24A. Otherwise, package 50 is similar to package 30 shown in FIG. 2A, except that a bottom surface 29 of molding compound 5 in package 50 is coplanar with mounting surfaces 2AM and 2BM of leads 2A and 2B. In package 50, SOI die 21A is mounted BOL-style on leads 2A and 2B and heat slug 2C by means of solder bumps 34A, 34B and 34C, respectively. Solder bumps 34A, 34B and 34C make electrical contact with and extend downward from contact pads 25A, 25B and 25C, respectively, which are located at the surface of active layer 24A.

SOI die 21A, solder bumps 34A, 34B and 34C, heat slug 2C and portions of leads 2A and 2B are encased in molding compound 5. Heat slug 2C has an exposed surface 28 coplanar with and surrounded by a bottom surface 29 of the molding compound 5. The bottom surface 28 of heat slug 2C is in contact with PCB 6.

As shown in FIG. 3A, there are three thermal paths by which the heat generated in active layer 24A may be conducted to PCB 6: The first path includes contact pad 25A, solder bump 34A, and lead 2A, the second path includes contact pad 25B, solder bump 34B, and lead 2B, and the third path includes contact pad 25C, solder bump 34C, and heat slug 2C. Each of these thermal paths may also serve as an electrical path connecting the circuitry in SOI die with PCB 6.

To facilitate heat transfer through heat slug 2C, the area of heat slug 2C taken through a horizontal cross section is substantially greater (e.g., three to five times or more greater) than the area of lead 2A or 2B taken through a cross section perpendicular to the walls of lead 2A or 2B, respectively.

Figure 3B:
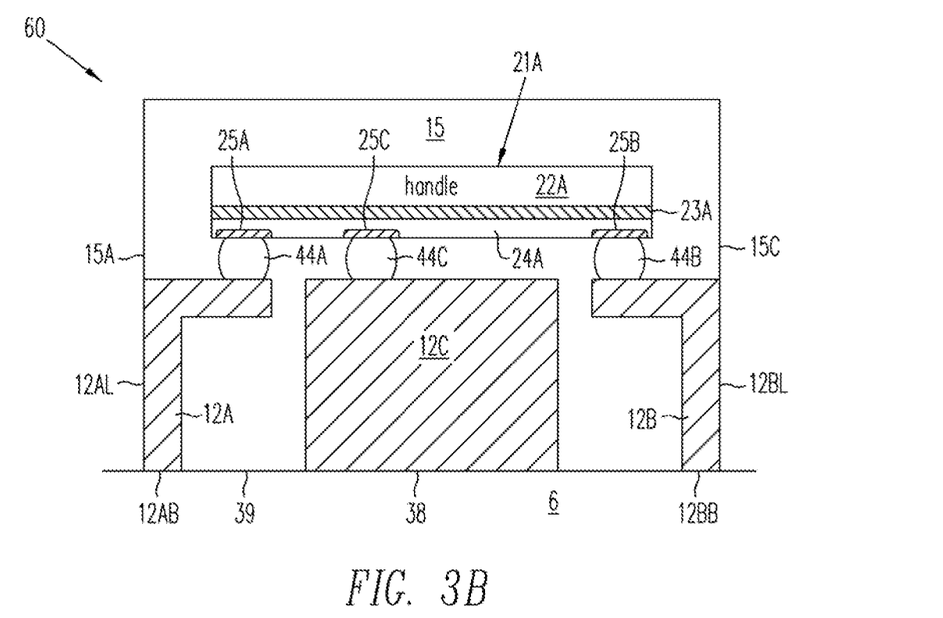
FIG. 3B shows a cross-sectional view of a Double Flat No-Lead (DFN) semiconductor package containing a BOL-mounted SOI die, with an exposed heat slug.

FIG. 3B illustrates SOI die 21A mounted in a Double Flat No-Lead (DFN) package 60. Package 60 is similar to package 40 shown in FIG. 2B, except that package 60 also contains an exposed die pad or heat slug 12C. In package 60 SOI die 21A is mounted BOL-style on leads 12A and 12B and heat slug 12C by means of solder bumps 44A, 44B and 44C, respectively. Solder bumps 44A, 44B and 44C make electrical contact with and extend downward from contact pads 25A, 25B and 25C, respectively, which are located at the surface of active layer 24A.

SOI die 21A, solder bumps 44A, 44B and 44C, leads 12A and 12B and heat slug 12C are encased in molding compound 15. Leads 12A and 12B have bottom surfaces 12AB and 12BB that are coplanar with a bottom surface 39 of molding compound 15 and lateral surfaces 12AL and 12BL that are coplanar with lateral surfaces 15A and 15C of molding compound 15. The bottom surfaces 12AB and 12BB of leads 12A and 12B and the bottom surface 38 of heat slug 12C are mounted to PCB 6.

As shown in FIG. 3B, there are three thermal paths by which the heat generated in active layer 24A may be conducted to PCB 6: The first path includes contact pad 25A, solder bump 44A, and lead 12A, the second path includes contact pad 25B, solder bump 44B, and lead 12B, and the third path includes contact pad 25C, solder bump 44C, and heat slug 12C. Each of these thermal paths may also serve as an electrical path connecting the circuitry in SOI die 21A with PCB 6.

To facilitate heat transfer through heat slug 12C, the area of heat slug 12C taken through a horizontal cross section is substantially greater (e.g., five times or more greater) than the area of lead 12A or 12B taken through a cross section perpendicular to the walls of lead 12A or 12B, respectively.

Figure 4:
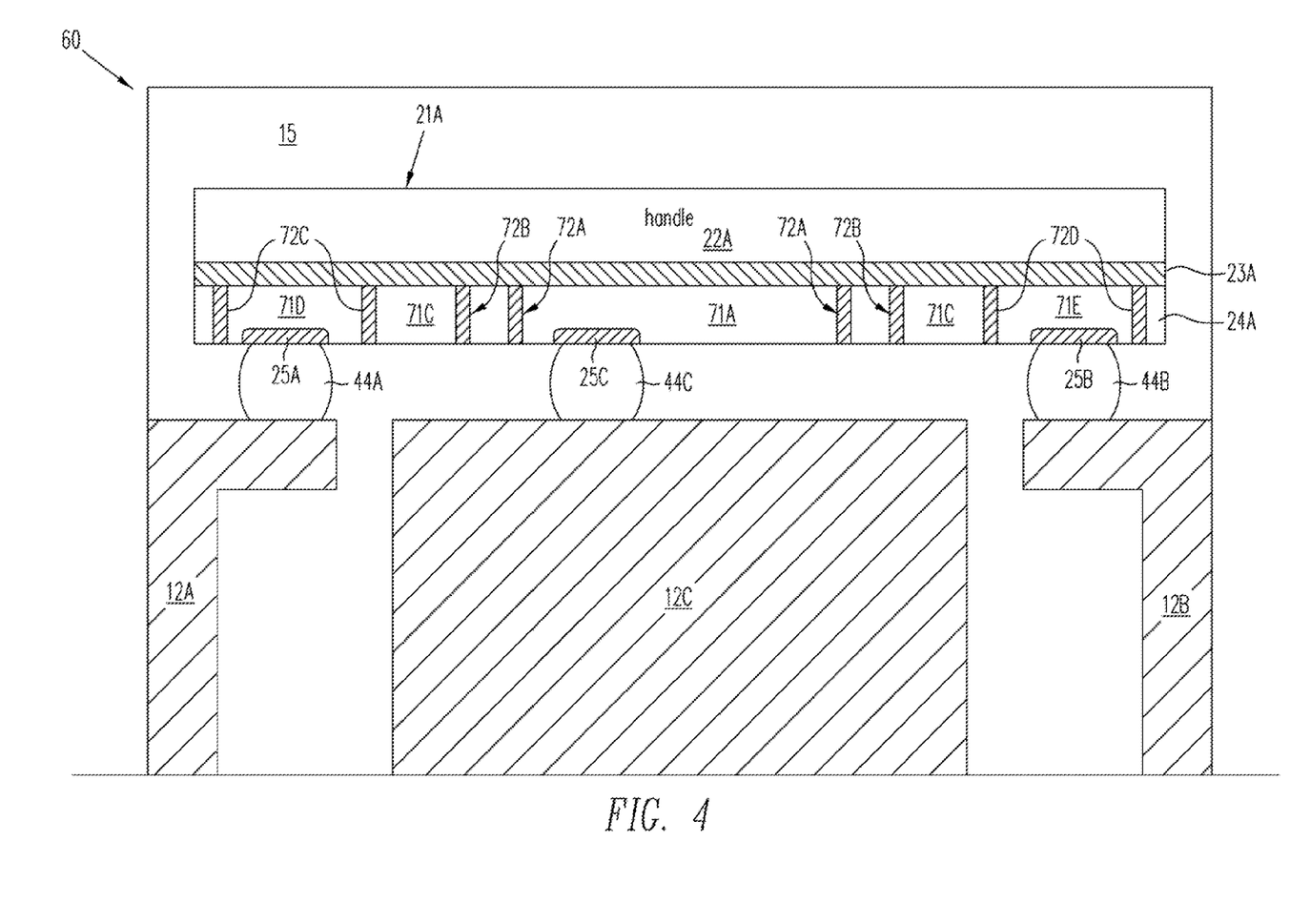
FIG. 4 is a more detailed cross-sectional view of the DFN package shown in FIG. 3B.

In some embodiments, the active layer of the SOI die is divided into "thermal islands," such that devices in one thermal island are insulated from heat generated by devices in another thermal island. FIG. 4 is a detailed cross-sectional view of the DFN package 60 of FIG. 3B, showing that the active layer 24A is pierced by insulating trenches 72A, 72B, 72C and 72D, creating thermal islands 71A, 71D and 71E. Trenches 72A, 72B, 72C and 72D are typically filed with an insulating dielectric such as silicon oxide, silicon nitride, thermally grown silicon dioxide with a deposited glass, or thermally grown silicon dioxide containing or surrounding a deposited polysilicon layer.

Figure 5:
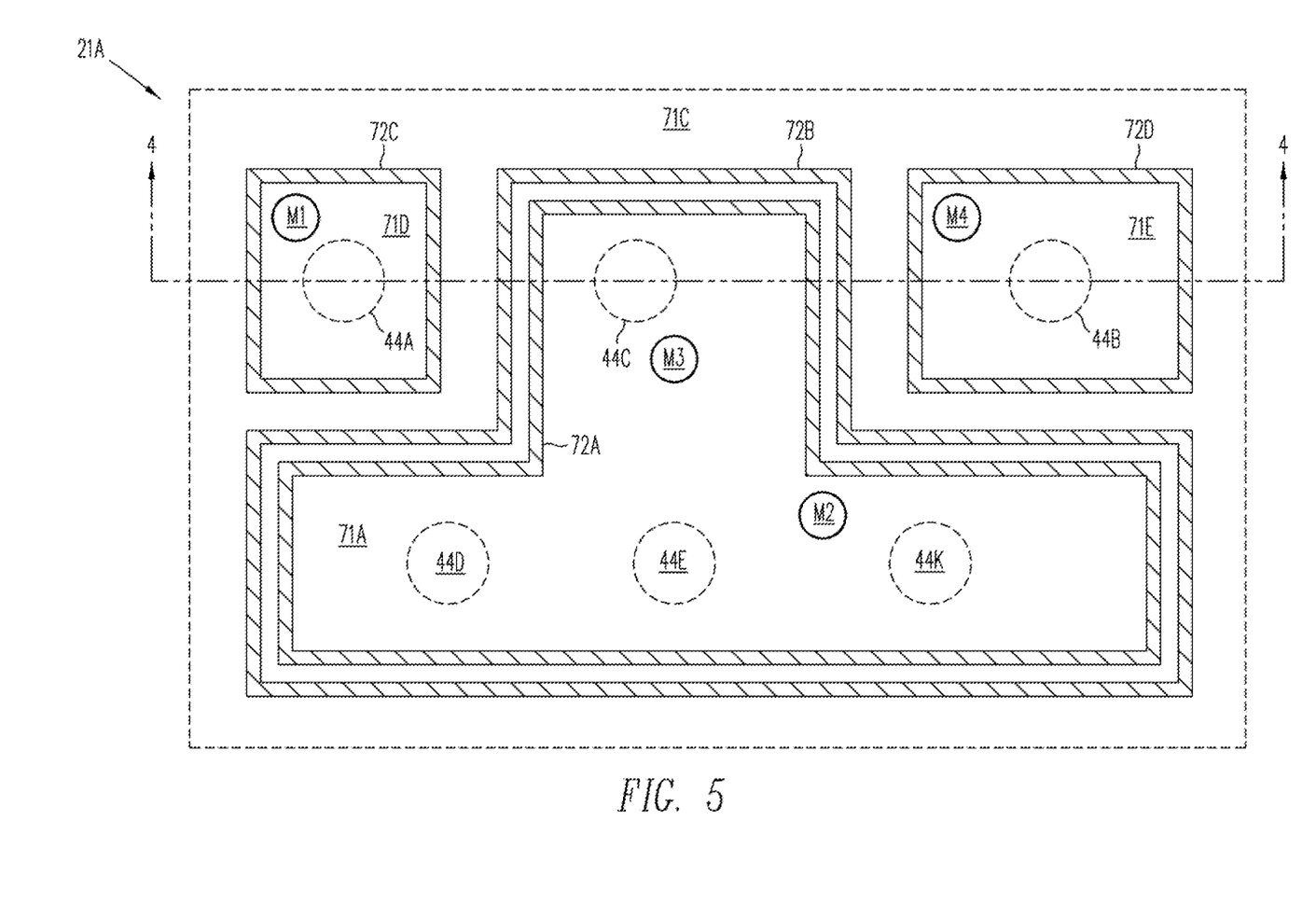
FIG. 5 is a plan view of the SOI die in the package of FIG. 3B, showing thermal islands isolated by trenches and one or more thermal vias extending from each thermal island.

FIG. 5 is a plan view of SOI die 21A in the package of FIG. 3B. The cross section 4-4 at which FIG. 4 is taken is indicated. As shown, each of trenches 72A, 72B, 72C and 72D is formed in the shape of a closed figure that surrounds a thermal island, i.e., trench 72C surrounds thermal island 71D, trench 72D surrounds thermal island 71E, and double trenches 72A and 72B surround thermal island 71A. Thermal island 71D contains a MOSFET M1, thermal island 71A contains MOSFETs M2 and M3, and thermal island 71E contains a MOSFET M4. An inter-island area 71C, not surrounded by one of trenches 72A, 72B, 72C and 72D, is also shown.

Viewing FIGS. 4 and 5 together, it can be seen that thermal island 71D is connected through contact pad 25A to a thermal path that includes solder bump 44A and lead 12A, thermal island 71E is connected through contact pad 25B to a thermal path that includes solder bump 44B and lead 12B, and thermal island 71A is connected through contact pad 25C to a thermal path that includes solder bump 44C and heat slug 12C. As shown in FIG. 5, thermal island 71A is also connected to heat slug via solder bumps 44D, 44E and 44K, which are outside the cross-section of FIG. 4.

Trenches 72A, 72B, 72C and 72D may be formed in active layer 24A by conventional photolithographic and etching processes. For example, a trench mask may be formed and patterned on the exposed surface of active layer 24A, with openings over the areas where the trenches are to be located. Active layer 24A may be etched through the openings in the trench mask down to the insulating layer 23A to form the trenches using a reactive ion etch, for example using hydrogen bromide (HBr) or sulfer-hexafluoride (SF6) or similar gases. The trenches are then thermally oxidized and may then be filed with an insulating material such as silicon dioxide or a semi-insulating material such as undoped polysilicon, by chemical vapor deposition. As known in the art, other materials and processes may be used for filling the trenches.

The above description is intended to be illustrative and not limiting. Many alternative embodiments of this invention will be apparent to persons of skill in the art. The broad principles of this invention are defined only in the following claims.

What is claimed is:

1. A semiconductor package comprising:
   a lead extending from the semiconductor package;
   a silicon-on-insulator (SOI) die including an insulating layer sandwiched between a handle layer and an active layer, the handle layer having a first surface in contact with the insulating layer and a second surface opposite to the first surface, the SOI die being oriented in the package with the active layer facing the lead;
   a first metal bump connecting a first contact pad at a surface of the active layer with the lead;
   a molding compound encasing the SOI die, the first metal bump, and at least a portion of the lead, the molding compound completely covering the second surface of the handle layer;
   a heat slug having a surface coplanar with and surrounded by a bottom surface of the molding compound; and
   a second metal bump connecting a second contact pad at the surface of the active layer with the heat slug.

2. The semiconductor package of claim 1 wherein a first thermal path configured to conduct heat generated in the active layer to a printed circuit board includes the first contact pad, the first metal bump, and the lead.

3. The semiconductor package of claim 2 wherein the thermal path is configured to electrically connect circuitry in the SOI die with the printed circuit board.

4. The semiconductor package of claim 2 wherein a second thermal path configured to conduct heat generated in the active layer to the printed circuit board includes the second contact pad, the second metal bump, and the heat slug.

5. The semiconductor package of claim 1 wherein a horizontal cross-sectional area of the heat slug is at least five times greater than an area of the lead taken at a cross-section perpendicular to a wall of the lead.

6. The semiconductor package of claim 1 wherein the first contact pad is formed in a thermal island in the active layer, the thermal island being defined by at least one dielectric filled trench, the trench extending between the surface of the active layer and the insulating layer and being laterally enclosed within the active layer.

7. The semiconductor package of claim 6 wherein the thermal island is surrounded by a double trench.

8. The semiconductor package of claim 6 wherein the thermal island contains at least one semiconductor device.

9. The semiconductor package of claim 1 wherein the lead protrudes from an outside surface of the molding compound.

10. The semiconductor package of claim 1 wherein the semiconductor package is a DFN-type package, the lead having at least one surface coplanar with an outside surface of the molding compound.

11. The semiconductor package of claim 10 wherein a horizontal cross-sectional area of the heat slug is at least five times greater than an area of the lead taken at a cross-section perpendicular to a wall of the lead.

12. The semiconductor package of claim 10 wherein the first contact pad is formed in a thermal island in the active layer, the thermal island being surrounded by at least one trench extending between the surface of the active layer and the insulating layer, the trench being filled with a dielectric material.

13. The semiconductor package of claim 12 wherein the second contact pad is formed in a second thermal island in the active layer, the second thermal island being surrounded by at least one second trench extending between the surface of the active layer and the insulating layer, the second trench being filled with the dielectric material.

14. The semiconductor package of claim 12 wherein the thermal island contains at least one semiconductor device.

15. The semiconductor package of claim 1 wherein a bottom surface of the molding compound is coplanar with a mounting surface of the lead.

16. A semiconductor package comprising:
a lead extending from the semiconductor package;
a silicon-on-insulator (SOI) die including an insulating layer sandwiched between a handle layer and an active layer, the handle layer having a first surface in contact with the insulating layer and a second surface opposite to the first surface, the SOI die being oriented in the package with the active layer facing the lead;
a first metal bump connecting a first contact pad at a surface of the active layer with the lead;
a molding compound encasing the SOI die, the first metal bump, and at least a portion of the lead, the molding compound completely covering the second surface of the handle layer;
a heat slug having a surface coplanar with and surrounded by a bottom surface of the molding compound; and
means for forming a thermal path between the surface of the active layer and the heat slug.

17. The semiconductor package of claim 16 wherein the lead protrudes from an outside surface of the molding compound.

18. The semiconductor package of claim 16 wherein the semiconductor package is a DFN-type package, the lead having at least one surface coplanar with an outside surface of the molding compound.

19. A semiconductor package comprising:
a lead extending from the semiconductor package;
a silicon-on-insulator (SOI) die including an insulating layer sandwiched between a handle layer and an active layer, the handle layer having a first surface in contact with the insulating layer and a second surface opposite to the first surface, the SOI die being oriented in the package with the active layer facing the lead;
a first metal bump connecting a first contact pad at a surface of the active layer with the lead;
a molding compound encasing the SOI die, the first metal bump, and at least a portion of the lead, the molding compound completely covering the second surface of the handle layer; and
a second contact pad formed at the surface of the active layer and within a thermal island formed in the active layer, the second contact pad thermally coupling the active layer to a heat slug.

20. The semiconductor package of claim 19 wherein the first contact pad is formed in a thermal island in the active layer, the thermal island being surrounded by at least one trench extending between the surface of the active layer and the insulating layer, the trench being filled with a dielectric material.

* * * * *